(12) United States Patent
Shitamichi et al.

(10) Patent No.: US 10,529,869 B2
(45) Date of Patent: Jan. 7, 2020

(54) ELECTRONIC COMPONENT, ELECTRONIC EQUIPMENT, AND METHOD FOR MANUFACTURING ELECTRONIC COMPONENT

(71) Applicant: CANON KABUSHIKI KAISHA, Tokyo (JP)

(72) Inventors: Taiki Shitamichi, Ebina (JP); Takashi Miyake, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/905,660

(22) Filed: Feb. 26, 2018

(65) Prior Publication Data

US 2018/0248051 A1 Aug. 30, 2018

(30) Foreign Application Priority Data

Feb. 28, 2017 (JP) .................. 2017-037712

(51) Int. Cl.
*H01L 31/0203* (2014.01)
*H01L 23/13* (2006.01)
(Continued)

(52) U.S. Cl.
CPC ........ *H01L 31/0203* (2013.01); *H01L 21/561* (2013.01); *H01L 23/13* (2013.01); *H01L 23/3128* (2013.01); *H01L 23/49838* (2013.01); *H01L 24/48* (2013.01); *H01L 24/97* (2013.01); *H01L 27/14618* (2013.01); *H01L 27/14636* (2013.01); *H01L 27/14683* (2013.01); *H01L 31/02005* (2013.01); *H01L 31/1876* (2013.01); *H05K 1/181* (2013.01); *H01L 2224/48096* (2013.01); *H01L 2224/48106* (2013.01); *H01L 2224/48227* (2013.01); *H01L 2924/12043* (2013.01); *H05K 2201/10121* (2013.01); (Continued)

(58) Field of Classification Search
None
See application file for complete search history.

(56) References Cited

U.S. PATENT DOCUMENTS 8,253,258 B2 * 8/2012 Sonobe ................. H01L 21/561
257/783
2005/0001219 A1 1/2005 Minamio
(Continued)

FOREIGN PATENT DOCUMENTS

JP 2005-26426 A 1/2005
JP 2007-66967 A 3/2007
(Continued)

*Primary Examiner* — Long Pham
(74) *Attorney, Agent, or Firm* — Canon U.S.A., Inc. I.P. Division (57) ABSTRACT

A connecting member includes a first part arranged between a first region of an electronic device and a board and a second part arranged between a second region of the electronic device and the board, a distance from an edge to the first part is longer than a distance from a center to the first part, and a distance from the edge to the second part is shorter than a distance from the center to the second part, a space is provided between the electronic device and the board and between the first part and the second part, and, in the board, a through hole communicating with the space is provided not to overlap with the center of the electronic device.

20 Claims, 6 Drawing Sheets (51) Int. Cl.
  *H01L 23/31*    (2006.01)
  *H01L 27/146*    (2006.01)
  *H01L 31/02*    (2006.01)
  *H01L 31/18*    (2006.01)
  *H01L 23/00*    (2006.01)
  *H01L 23/498*    (2006.01)
  *H01L 21/56*    (2006.01)
  *H05K 1/18*    (2006.01)

(52) U.S. Cl.
  CPC .............. *H05K 2201/10151* (2013.01); *H05K 2201/10174* (2013.01); *H05K 2201/10378* (2013.01); *H05K 2201/10734* (2013.01)

(56) References Cited

U.S. PATENT DOCUMENTS

2008/0237768 A1   10/2008   Yajima
2010/0252923 A1   10/2010   Watanabe

FOREIGN PATENT DOCUMENTS

| | | |
|---|---|---|
| JP | 2008-28425 A | 2/2008 |
| JP | 2008-98644 A | 4/2008 |
| JP | 2008-251712 A | 10/2008 |
| JP | 2008-283004 A | 11/2008 |
| JP | 2010-238731 A | 10/2010 |
| JP | 2010-245337 A | 10/2010 |
| JP | 2016-111270 A | 6/2016 |
| JP | 2016-169952 A | 9/2016 |

\* cited by examiner

ELECTRONIC COMPONENT, ELECTRONIC EQUIPMENT, AND METHOD FOR MANUFACTURING ELECTRONIC COMPONENT

BACKGROUND OF THE INVENTION

Field of the Invention

The present disclosure relates to an electronic component.

Description of the Related Art

In an electronic component, an electronic device is connected to a mounting board via a connecting member. A space exists between the electronic device and the mounting board in some cases, and reliability of the electronic component may be lowered due to the existence of this space.

Japanese Patent Laid-Open No. 2010-238731 discloses a technique in which an interconnection board includes a through hole communicating with a spaced portion provided between a rear surface of a semiconductor chip and a front surface of the interconnection board.

SUMMARY OF THE INVENTION

In the technique in Japanese Patent Laid-Open No. 2010-238731, the center of the semiconductor chip is not supported, which causes a problem in which the semiconductor chip is easily deformed, and in which improvement of reliability is insufficient.

An aspect of the present disclosure is to improve reliability of an electronic component.

To solve the above problem, there is provided an electronic component including a board, an electronic device arranged over the board, and a connecting member arranged between the board and the electronic device, wherein the electronic device includes a first region including a center of the electronic device and a second region between the first region and an edge of the electronic device, wherein the connecting member includes a first part arranged between the first region of the electronic device and the board and a second part arranged between the second region of the electronic device and the board, wherein a distance from the edge to the first part is longer than a distance from the center to the first part, and a distance from the edge to the second part is shorter than a distance from the center to the second part, wherein a space is provided between the electronic device and the board and between the first part and the second part, and wherein, in the board, a through hole communicating with the space is provided not to overlap with the center of the electronic device.

Also, to solve the above problem, there is provided an electronic component including a board, an electronic device arranged over the board, and a connecting member arranged between the board and the electronic device, wherein the connecting member is arranged to overlap with a center of the electronic device, wherein a space is provided between the electronic device and the board, and wherein, in the board, a through hole communicating with the space is provided.

Further, to solve the above problem, there is provided a method for manufacturing an electronic component including preparing a board, preparing an electronic device including a first region including a center of the electronic device and a second region between the first region and an edge of the electronic device, connecting the board to the electronic device via a connecting member arranged between the board and the first region of the electronic device, and, after the connecting, causing a space between the board and the electronic device to communicate with an open space on an opposite side of the electronic device with respect to the board.

Further features of the present disclosure will become apparent from the following description of exemplary embodiments (with reference to the attached drawings).

DESCRIPTION OF THE EMBODIMENTS

Embodiments of the present disclosure will be described below with reference to the drawings. It is to be noted that, in the following description and drawings, components common to a plurality of drawings are shown with common reference signs. Accordingly, the common components will be described with reference to the plurality of drawings, and description of the components shown with the common reference signs will be omitted as needed.

First Embodiment

A structure of an electronic component 1 according to a first embodiment will be described with reference to a schematic cross-sectional view in FIG. 1A and a schematic plan view in FIG. 1B.

A mounting board 2 includes a front surface 3 and a rear surface 4 and includes on the front surface 3 a mounting region 6 on which an electronic device 5 is to be attached. The mounting board 2 is made of a resin material such as a ceramic, glass epoxy, paper phenol, and various plastic resin materials and has a thickness of approximately 0.1 to 1.0 mm.

The mounting board 2 includes a plurality of external connection terminals 7, internal interconnection 8, and a plurality of internal connection terminals 9. The external connection terminals 7 are electrically connected to the internal connection terminals 9 via the internal interconnection 8. The external connection terminals 7 are provided to be exposed on the rear surface 4 of the mounting board 2. The group of the internal connection terminals 9 is provided on the front surface 3 of the mounting board 2. Examples of arrangement of the external connection terminals 7 are a land grid array (LGA) type, in which the external connection terminals 7 are provided on the rear surface 4, and a leadless chip carrier (LCC) type, in which the external connection terminals 7 are provided from the side surface through the rear surface 4.

Examples of the electronic device 5 are a driver IC, an amplifier IC, a memory IC, and an optical device. An example of the optical device is a light receiving device such as an auto focus sensor measuring a distance to a light source based on the positional relationship of a photodiode located at a focal point position of light split into two by a lens. Another example of the optical device may be an imaging device, such as a CCD sensor and a CMOS sensor, generating image data with use of a plurality of pixels arranged in an array. Still other examples of the optical device may be a display device such as an LCOS display and an organic EL display and a light emitting device such as an LED.

Figure 1A:
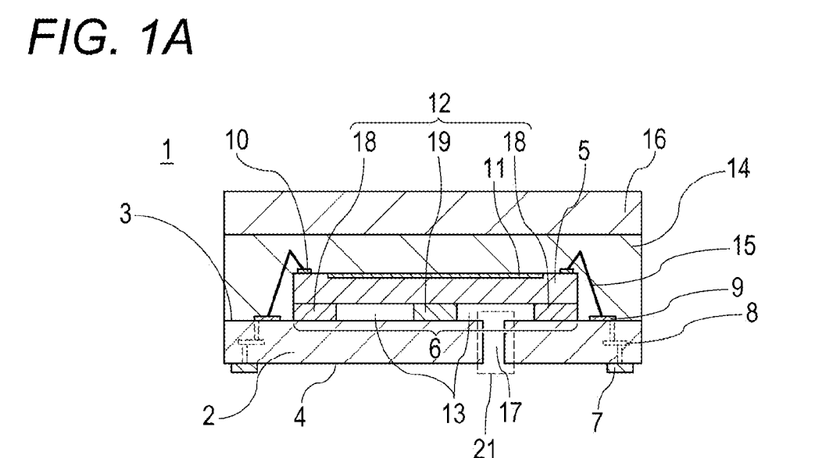
FIGS. 1A-1C illustrate schematic cross-sectional views and schematic plan views illustrating an electronic component.
Figure 1B:
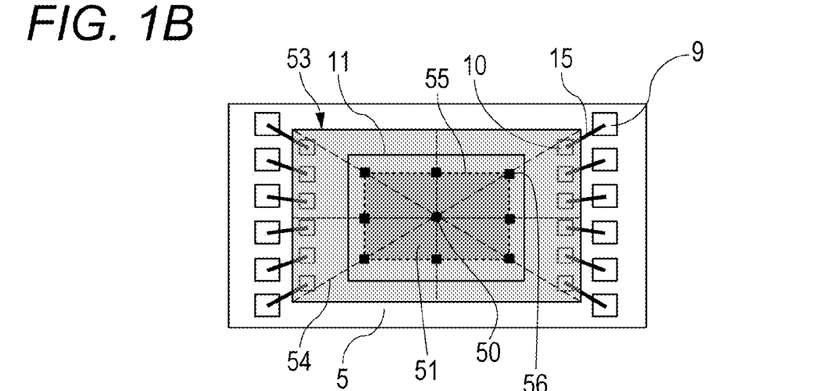

As illustrated in FIG. 1B, the electronic device 5 includes a central region 51 and a peripheral region 52. The central region 51 is a region including a center 50 of the electronic device 5. The peripheral region 52 is a region between the central region 51 and an edge 53 of the electronic device 5. The center 50 of the electronic device 5 corresponds to a midpoint of a longest line segment 54 among line segments each connecting two points on the edge 53 of the electronic device 5. Since the edge 53 of the typical electronic device 5 is formed in a rectangular shape, the line segment 54 is a line segment connecting opposing corners of the edge 53. Strictly speaking, since the electronic device 5 has a certain thickness, the center 50 is located inside the electronic device 5. In the electronic device 5 in which the length of the line segment 54 is longer than the thickness of the electronic device 5, the location of the center 50 in the thickness direction of the electronic device 5 may be ignored. The present embodiment is suitable for a case in which the electronic device 5 in which the length of the line segment 54 is ten or more times as long as the thickness of the electronic device 5 is used. The central region 51 and the peripheral region 52 are adjacent to each other at a boundary 55. The boundary 55 is defined as a line connecting midpoints of a plurality of line segments connecting the center 50 to respective points on the edge 53. In FIG. 1B, representative line segments connecting the center 50 to respective points on the edge 53 are illustrated, and midpoints of the line segments are illustrated as solid black quadrangles. A line connecting the solid black quadrangles representing the midpoints is the boundary 55.

The electronic device 5 includes electrodes 10 to be used to be electrically connected to the internal connection terminals 9 of the mounting board 2. A conductive member 15 electrically connects each of the internal connection terminals 9 to each of the electrodes 10. The conductive member 15 connects the electrode 10 via the internal interconnection 8 of the mounting board 2 to the external connection terminal 7 and acts as a path for input/output signals between the mounting board 2 and the electronic device 5. The conductive member 15 is a metal wire made of Au, Ag, or the like and has a diameter of approximately 17 to 30 μm.

The electronic device 5 is attached to the mounting region 6 of the mounting board 2 by a connecting member 12. The connecting member 12 has a thickness of approximately 5 to 100 μm and is thermally cured resin, ultraviolet cured resin, thermoplastic resin, a double-sided tape, or the like.

The connecting member 12 includes a peripheral part 18 provided between the peripheral region 52 of the electronic device 5 and the mounting region 6 of the mounting board 2 and a central part 19 provided between the central region 51 of the electronic device 5 and the mounting region 6 of the mounting board 2. A distance from the edge 53 to the central part 19 is longer than a distance from the center 50 to the central part 19. Also, a distance from the edge 53 to the peripheral part 18 is shorter than a distance from the center 50 to the peripheral part 18. Here, the distance means a shortest distance from the center 50 or the edge 53 to a front surface of the connecting member 12. Meanwhile, in a case in which the central part 19 exists directly below the center 50, a distance between the center 50 and the central part 19 is approximately a half of the thickness of the electronic device 5. In a position overlapping with a line segment connecting the center 50 to the edge 53, a space 13 is preferably provided between the central part 19 and the peripheral part 18. Also, in a position passing the center 50 and overlapping with a line segment connecting two points on the edge 53, the space 13 is preferably provided between the central part 19 and the peripheral part 18.

The space 13 is provided between the electronic device 5 and the mounting board 2 and between the central part 19 and the peripheral part 18. The space 13 is a space surrounded by the electronic device 5, the front surface 3, and the peripheral part 18 of the connecting member 12 and containing gas. In the present embodiment, the electronic device 5 is covered with a resin member 14. The resin member 14 is light transmitting ultraviolet cured resin or thermally cured resin made of acrylic resin, epoxy resin, or the like and has a thickness of approximately 0.3 to 1.0 mm.

A translucent member 16 may also be provided on the resin member 14. The translucent member 16 is made of borosilicate glass, a crystal, sapphire, phosphate glass, fluorophosphate glass, or the like.

An opening portion 21 is provided with a through hole 17 penetrating the front surface 3 and the rear surface 4 of the mounting board 2 in the thickness direction. The through hole 17 communicates with the space 13 and causes the space 13 to communicate with an external space of the electronic component 1. The external space of the electronic component 1 is a space on an opposite side of the electronic device 5 (on a side of the rear surface 4) with respect to the mounting board 2. A plurality of opening portions may be provided per space 13. However, to shorten processing time and reduce processing cost, it is preferable to provide one through hole 17 per space 13.

Figure 1C:
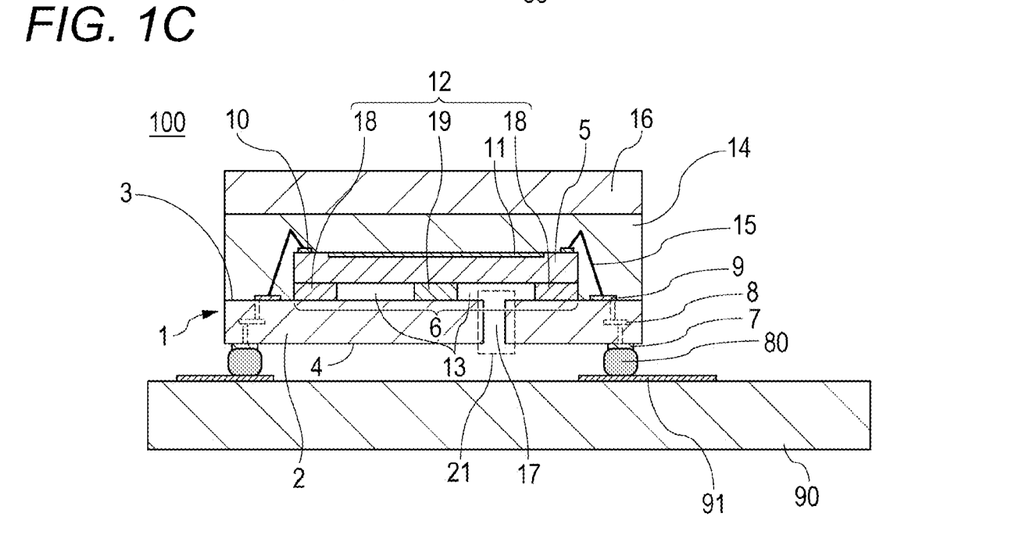

FIG. 1C is a schematic view illustrating a main part of an electronic equipment 100 including the electronic component 1. The electronic equipment 100 includes the electronic component 1 and an interconnection board 90 mounting the electronic component 1 thereon. The electronic equipment 100 also includes a solder member 80 provided between the mounting board 2 of the electronic component 1 and the interconnection board 90. The solder member 80 mutually solders the external connection terminal 7 of the mounting board 2 and interconnection 91 provided on the interconnection board 90. Such soldering can be achieved by reflow soldering. The electronic equipment 100 is a camera or an information terminal and may be a transportation apparatus such as an automobile and an aircraft. In the present embodiment, the through hole 17 causes the space 13 to communicate with the external space of the electronic component 1 in the electronic equipment 100. However, the through hole 17 communicating with the space 13 may be in a state of not communicating with the external space of the electronic component 1 by arranging a sealing member such as a seal on the rear surface 4. That is, communication between the space 13 and the external space has only to be performed at a required time (at the time of manufacture, at the time of transportation, at the time of use, or the like).

The space 13 is formed and communicates with the external part of the electronic component 1. As a result, even in a case in which the electronic component 1 absorbs vapor when the electronic component 1 is heated at the time of reflow soldering to generate heat, vapor-containing gas and expanded gas are exhausted to the outside through the opening portion 21. Accordingly, since internal pressure of the space 13 in the electronic component 1 does not increase even in a case in which the electronic component 1 is heated, generation of cracks in the resin member 14 can be restricted. Also, since the space 13 communicates with the external part, the electronic device 5 can be restricted from being deformed to be protruded upward due to an increase of pressure in the space 13.

Here, referring to plan views in FIGS. 2A to 2D, the relationship among the electronic device 5, the peripheral part 18 and the central part 19 of the connecting member 12, and the through hole 17 will be described.

Each of FIGS. 2A to 2D is a view of the electronic component 1 as seen from an upper side and schematically illustrates a shape of the connecting member 12 located under the electronic device 5 over the mounting board 2 and a position of the through hole 17. The mounting region 6 is formed to be approximately congruent with the electronic device 5. Dotted lines divide the electronic device 5 to be mounted (or the mounting region) into sixteen areas: four columns in the vertical direction and four rows in the horizontal direction. To provide the central part 19 of the connecting member 12, the through hole 17 is preferably provided not to overlap with the center 50. The through hole 17 is prevented from overlapping with the center 50 to enable a distance between the through hole 17 and the central part 19 to be extended and enable a possibility that the connecting member 12 closes the through hole 17 to be decreased.

Figure 2A:
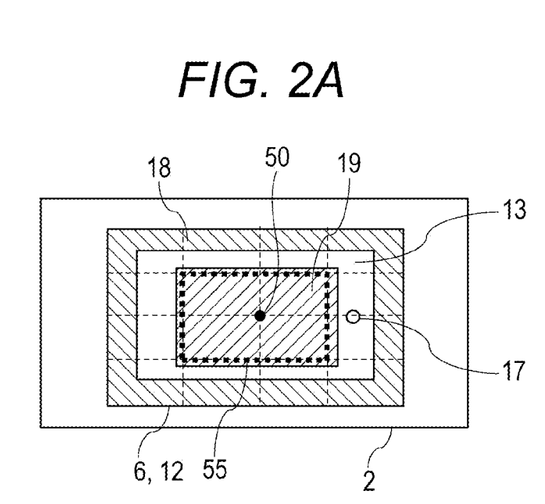
FIGS. 2A-2D illustrate schematic plan views illustrating the electronic component.

FIG. 2A illustrates a first example. The peripheral part 18 is arranged on the outermost periphery of the mounting region 6 and is in an annular shape. Thus, the space 13 is surrounded by the peripheral part 18 of the connecting member 12. The electrodes 10 of the electronic device 5 are arranged on the periphery of the electronic device 5, and the peripheral part 18 is located directly below the electrodes 10. As described below in a manufacturing method in FIGS. 3A-3I, the electrodes 10 and the internal connection terminals 9 of the mounting board 2 are connected via the conductive members 15 by means of ultrasonic thermocompression wire bonding. Arranging the connecting member 12 directly below the electrodes 10 facilitates transmission of ultrasound into the electrodes 10 at the time of connection to the conductive members 15 and provides stable connection intensity.

Also, the peripheral part 18 is annular, which is favorable for the configuration of the electronic component 1 in which the electronic device 5 is covered with the resin member 14. The reason for this is that forming the peripheral part 18 in the annular shape can prevent the resin member 14 from entering the space 13. Accordingly, since the space 13 can be formed in a favorable manner, and the resin member 14 can be prevented from entering the through hole 17, the through hole 17 can be restricted from being closed by the resin member 14.

Further, since the peripheral part 18 of the connecting member 12 supports the periphery of the electronic device 5 when the electronic device 5 is arranged on the connecting member 12, the electronic device 5 can be prevented from being inclined.

The peripheral part 18 is preferably annular since, during manufacture, the resin member 14 before cure may enter the space 13, and foreign substances may enter the through hole 17. Here, the annular shape is a seamlessly-connected ring-like shape of the connecting member 12. The annular shape of the peripheral part 18 also means arrangement of the peripheral part 18 at least in twelve areas corresponding to the periphery out of the sixteen matrix-like areas. Also, the peripheral part 18 may be provided to be slightly extended from the electronic device 5.

The central part 19 is preferably provided between the central region 51 of the electronic device 5 and the mounting region 6 of the mounting board 2. Since flexure of the electronic device 5 is maximum at the central region 51, the central part 19 adapted to restrict the flexure is preferably provided between the center 50 of the electronic device 5 and the mounting region 6 of the mounting board 2. Here, the central region 51 can be defined as at least one of four internal areas out of the sixteen matrix-like areas. In particular, providing the central part 19 between the center 50 of the chip and the mounting region 6 of the mounting board 2 exerts an effect of restricting the flexure, which is preferable. In FIG. 2A, although the central part 19 is provided in one location, the central part 19 may be divided and provided in a plurality of locations.

Figure 2B:
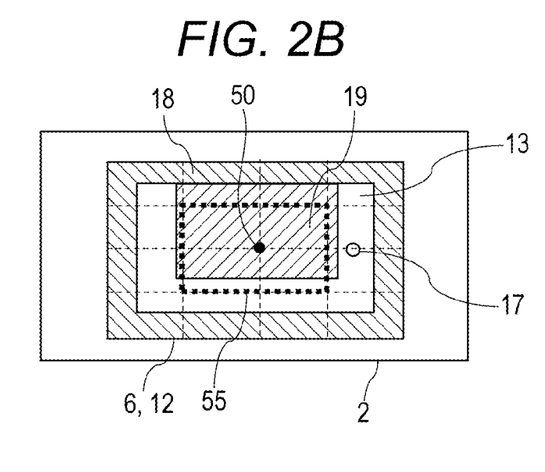

Also, in the example in FIG. 2A, the peripheral part 18 and the central part 19 do not contact, and the central part 19 is independent from the peripheral part 18. Thus, the central part 19 of the connecting member 12 is surrounded by the space 13. As illustrated in FIG. 2B, the central part 19 may be arranged to be continuous with the peripheral part 18 without being surrounded by the space 13. In this case, however, the amount of the connecting member 12 increases at a wide part of the connecting member 12, and the through hole 17 may be closed by the connecting member 12. Accordingly, as illustrated in FIG. 2A, it is preferable to provide the central part 19 independently from and discontinuously with the peripheral part 18.

The connecting member 12 to be arranged at the peripheral part 18 and the central part 19 is fluid at the time of application. When the connecting member 12 is to be mounted on the electronic device 5, the connecting member 12 is pressed and spread and increases the area. For this reason, to prevent the through hole 17 from being closed by the connecting member 12, the through hole 17 is preferably located at the midpoint of the distance between the central part 19 and the peripheral part 18.

The area of the central part 19 is preferably larger since the flexure of the chip can be restricted. However, when the area is excessively enlarged, the through hole 17 will be closed. Accordingly, the area of the central part 19 is preferably approximately 10 to 40% of the area of the electronic device 5.

Similarly, as the area of the peripheral part 18 is larger, inclination of the chip can be restricted. However, when the area is excessively enlarged, the through hole 17 will be closed in a similar manner to that in the above case. Accordingly, the width of the peripheral part 18 is preferably a width of 30% or less from the periphery of the electronic device 5.

The through hole 17 is preferably located at the midpoint of the distance between the peripheral part 18 and the central part 19 of the connecting member 12 to be less influenced by inflow of the connecting member 12. Also, at a part on an internal angle side of a right-angle-shaped part of the peripheral part 18 or the central part 19, the amount of the connecting member 12 tends to be large. Thus, the through hole 17 is preferably provided around a center of a short side of the electronic device 5.

Also, the size of the through hole 17 is appropriately designed depending on the size of the space 13 not to generate an increase of internal pressure, and the diameter of the through hole 17 is preferably approximately 50 to 500 µm.

Figure 2C:
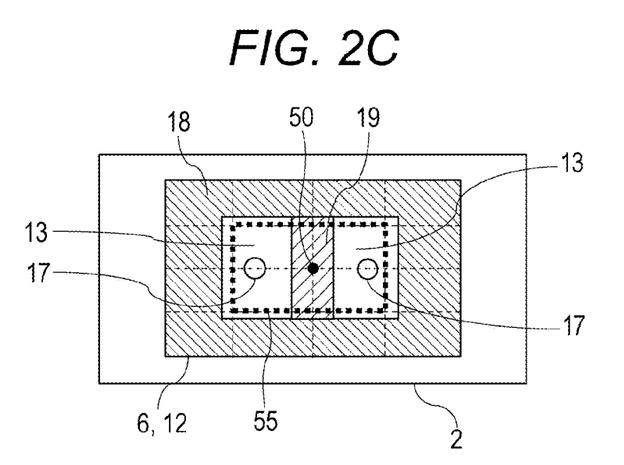

In FIG. 2C, the space 13 is provided to be divided into two by the central part 19. The central part 19 is provided to be continuous with the peripheral part 18. Thus, FIG. 2C is a schematic view in which two spaces 13 are provided. In this case, in which the plurality of spaces 13 are formed between the electronic device 5 and the mounting board 2, the through hole 17 is preferably provided to correspond to each of the plurality of spaces 13. The reason for this is that providing the through hole 17 to correspond to each of the spaces 13 is effective to prevent an increase of internal pressure in each of the spaces 13.

Figure 2D:
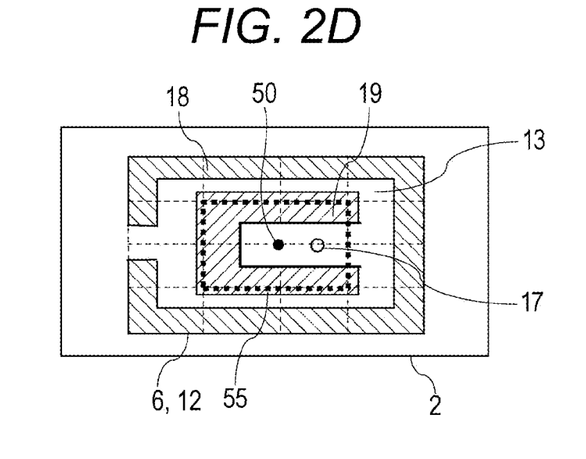

Next, FIG. 2D is a schematic view of a case in which the annular peripheral part 18 is partially opened. In this case, although the surrounding resin member 14 may flow into the opening depending on the size of the opening, the peripheral part 18 may partially be opened. In this case, by arranging the through hole 17 away from the opening of the peripheral part 18, the resin is less likely to flow into the through hole 17, and the similar effect can be exerted. Also, in FIG. 2D, no connecting member 12 is arranged between the center 50 and the mounting board 2. However, since the central part 19 is arranged in a part between the central region 51 and the mounting board 2 except the center 50, reliability can be improved sufficiently.

To obtain a stable yield ratio, a preferable shape of the electronic device 5 is a rectangle. In the case of the rectangle, in a case in which the peripheral part 18 is arranged between the peripheral region 52 and the mounting board 2, and in which the central part 19 is arranged between the central region 51 and the mounting board 2, the width of the space 13 between the peripheral part 18 and the central part 19 can be long. In the case in which the width of the space 13 between the peripheral part 18 and the central part 19 is long, a distance from the peripheral part 18 to the through hole 17 and a distance from the central part 19 to the through hole 17 can be long when the through hole 17 is provided at the midpoint between the peripheral part 18 and the central part 19. That is, even when the connecting member 12 spreads, the connecting member 12 is less likely to reach the through hole 17, and the electronic component 1 can be manufactured in a stable manner. For this reason, the electronic device 5 is preferably rectangular.

Hereinbelow, a method for manufacturing the electronic component 1 will be described with reference to FIGS. 3A-3I.

Figures 3A, 3B, 3C, 3D, 3E, 3F, 3G, 3H, 3I:
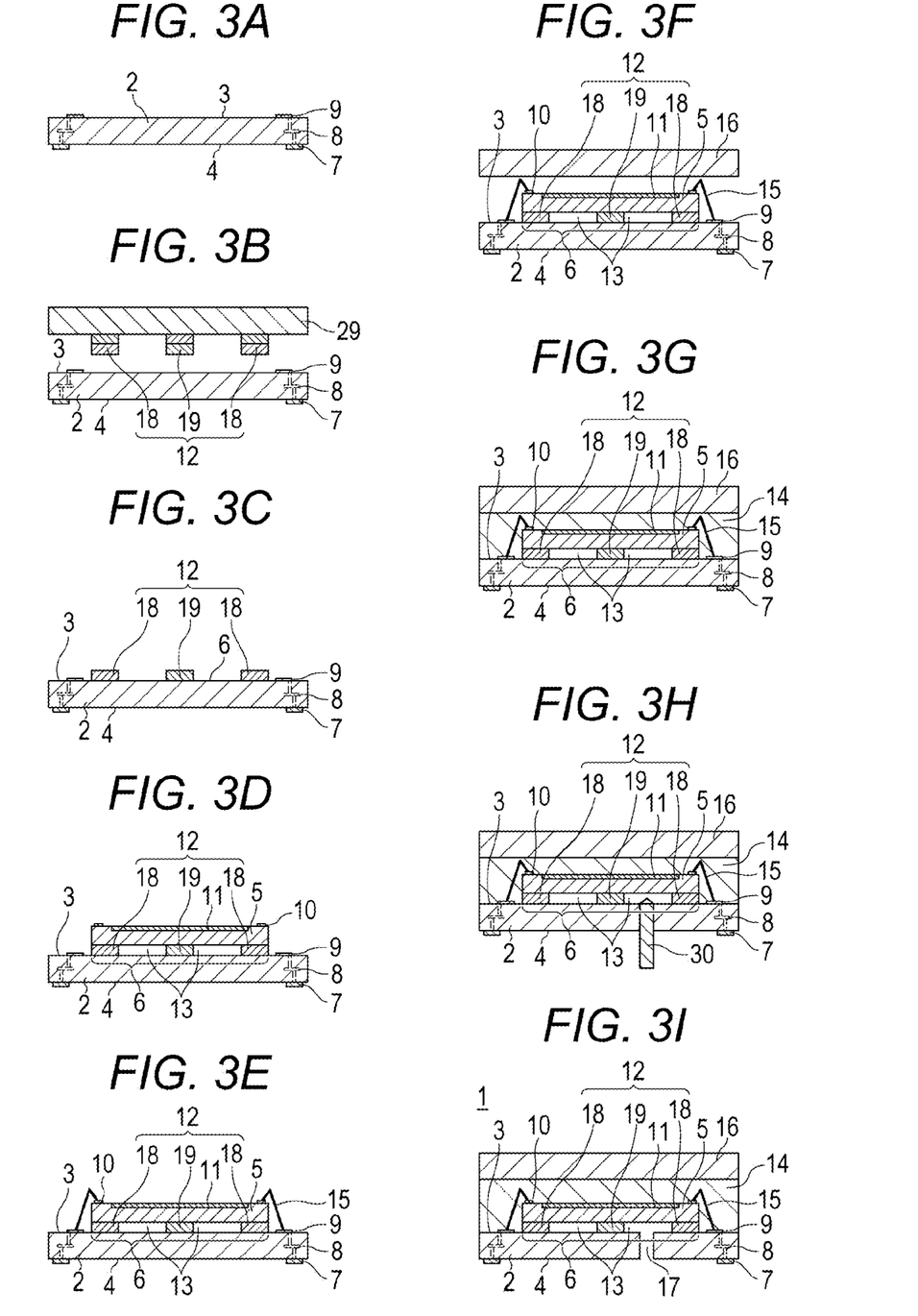
FIGS. 3A-3I illustrate schematic views illustrating a method for manufacturing the electronic component.

FIG. 3A illustrates a process of preparing the mounting board 2 including the front surface 3 and the rear surface 4 and including on the front surface 3 the mounting region 6 for the electronic device 5.

Subsequently, in processes illustrated in FIGS. 3B and 3C, the electronic device 5 is mounted on the mounting board 2. The connecting member 12 is arranged on the electronic device 5 or the mounting region 6 for the electronic device 5 on the mounting board 2. The peripheral part 18 of the connecting member 12 is provided between the peripheral region 52 of the electronic device 5 and the mounting region 6 of the mounting board 2. The central part 19 of the connecting member 12 is provided between the central region 51 of the electronic device 5 and the mounting region 6 of the mounting board 2.

As a method for arranging the connecting member 12, screen printing, transfer stamping, or dispensing can be used. FIG. 3C illustrates transfer using a stamp 29 adapted to transfer the connecting member 12. FIG. 3B illustrates a process of attaching the connecting member 12 to the stamp 29. FIG. 3C illustrates a process of bringing the stamp 29 into contact with the mounting board 2 to form the peripheral part 18 and the central part 19 of the connecting member 12. The transfer stamping is favorable in that the connecting member 12 can be arranged at a time to enable processing time to be shortened and in that maintenance work is easy. The stamp 29 is a processed object made of SUS, aluminum, resin, or the like and has protrusions and recesses on a surface thereof opposed to the mounting board 2. A thin film of the connecting member 12 is prepared on a not-illustrated transfer board, and the protrusions and recesses of the stamp 29 are brought into contact with the thin film of the connecting member 12 to attach the connecting member 12 only to the protrusions of the stamp 29. The stamp 29 to which the connecting member 12 is attached is brought into contact with the mounting board 2 to transfer the connecting member 12 attached to the protrusions of the stamp 29 onto the mounting board 2. The protrusions of the stamp 29 are processed in a desired pattern to be arranged equally to the peripheral part 18 and the central part 19 of the connecting member 12 on the mounting board 2.

The rear surface 4 of the mounting board 2 is vacuum-adsorbed and secured on a stage for supporting the mounting board 2 provided in a manufacturing apparatus so that the peripheral part 18 and the central part 19 of the connecting member 12 can be arranged at desired positions.

In the present embodiment, although the peripheral part 18 and the central part 19 of the connecting member 12 are arranged on the mounting region 6 of the mounting board 2, the connecting member 12 may be arranged on a surface of the electronic device 5 opposed to the mounting board 2. Alternatively, the peripheral part 18 may be arranged on the electronic device 5 while the central part 19 may be arranged on the mounting region 6 on the mounting board 2 to be provided with the electronic device 5. Alternatively, the central part 19 may be arranged on the electronic device 5 while the peripheral part 18 may be arranged on the mounting region 6.

FIG. 3D illustrates a process of mounting the electronic device 5 on the connecting member 12 and connecting the electronic device 5 to the mounting board 2 to form the space 13 surrounded by the electronic device 5, the front surface 3 of the mounting board 2, and the peripheral part 18 of the connecting member 12.

Multiple electronic devices 5 are manufactured on a disk-like silicon wafer, the wafer is diced by a dicing apparatus into individual electronic devices 5. Each individual electronic device 5 is vacuum-adsorbed with use of a rubber collet and is brought into contact with the mounting board 2. After contact, vacuum adsorption of the rubber collet is released to cause the electronic device 5 to be arranged on the mounting board 2. Subsequently, the electronic component 1 is heated to reach a temperature at which the connecting member 12 is cured to attach the electronic device 5 to the mounting board 2. As a result of this processing, the space 13 is formed at a region surrounded by the electronic device 5, the front surface 3 of the mounting board 2, and the peripheral part 18 of the connecting member 12.

To secure mounting accuracy of the electronic device 5 on the mounting board 2, the rear surface 4 of the mounting board 2 is vacuum-adsorbed and secured on the stage for supporting the mounting board 2 provided in the manufacturing apparatus.

FIG. 3E illustrates a wire bonding process in which the internal connection terminal 9 of the mounting board 2 and the electrode 10 of the electronic device 5 are connected by the conductive member 15. A gold wire of the conductive member 15 is connected to the electrode 10 of the electronic device 5 and is then connected to the internal connection terminal 9 of the mounting board 2 by means of ultrasonic thermal compression bonding.

FIGS. 3F and 3G illustrate a process of covering the electronic device 5 with the resin member 14.

In FIG. 3F, the translucent member 16 is secured over the electronic device 5 to provide a gap between the translucent member 16 and the electronic device 5. Subsequently, in FIG. 3G, the resin member 14 is filled into the gap between the translucent member 16 and the mounting board 2 by means of injection. Subsequently, the resin member 14 is cured. The electronic component 1 is heated in a case in which the resin member 14 is thermally cured resin while the electronic device 5 is irradiated with ultraviolet from the upper part of the translucent member 16 in a case in which the resin member 14 is ultraviolet cured resin.

FIG. 3H illustrates a process of forming the through hole 17 communicating the space 13 with the external part of the electronic component 1. By penetrating the front surface 3 and the rear surface 4 of the mounting board 2, the through hole 17 is formed, and the space 13 and the external part of the electronic component 1 communicate with each other. Examples of a way for communication are a mechanical way such as a drill, an optical way such as YAG laser and $CO_2$ laser, and a way of opening the hole by increasing internal pressure. In FIG. 3H, an opening way with use of a processing machine 30 such as a drill is illustrated. FIG. 3I illustrates the completed electronic component 1 according to the first embodiment.

For electric and mechanical protection, the electronic component 1 can employ a package structure in which the electronic device 5 is covered with resin and sealed or a hollow package structure in which the electronic device 5 is secured on the mounting board 2 having a cavity and sealed by the translucent member 16.

In a case in which the electronic component 1 is to be mounted on an interconnection board by means of soldering, a heating method with use of a highly productive reflow furnace is normally used. In the reflow heating, not only the external connection terminal to be mounted on the interconnection board but also the entire electronic component 1 is heated.

When the electronic component 1 absorbs vapor, the vapor accumulates in the space 13 and a room existing in the apparatus, the internal pressure of the space 13 and the room increases, and the space 13 may be expanded at the time of reflow. This may cause a problem in which the resin member 14 and the electronic device 5 are cracked, and in which the electronic device 5 itself is deformed. As a measure against the problem, improvements can be carried out such as an improvement of a vapor absorption control method in a manufacturing process to reduce the vapor absorption amount of the electronic component 1 and designing of the package structure to release vapor even when the electronic component 1 absorbs the vapor. As an example of designing the package structure, the through hole 17 is provided in the space 13 in the electronic component 1 to connect the space 13 to the external part of the electronic component 1, and vapor generated by reflow heating can be released to the outside.

The package structure in which the electronic device 5 is secured on the mounting board 2 with use of the connecting member 12 and is covered with resin and sealed is favorable. In one conceivable structure, the connecting member 12 is arranged only between the peripheral region 52 of the electronic device 5 and the mounting board 2 to form the space 13 surrounded by the mounting board 2 and the connecting member 12 between the peripheral region 52 of the electronic device 5 and the mounting board 2. The mounting board 2 is provided with the through hole 17 to cause the space 13 to communicate with the external part of the electronic component 1. In the electronic component 1 configured as above, even when the pressure in the space 13 increases at the time of heating, the pressure can be released through the through hole 17 to the outside, and damage of the electronic component 1 can be restricted. However, in a case in which the electronic device 5 is secured to the mounting board 2 by the connecting member 12 only at the peripheral region 52, the electronic device 5 will be flexed and deformed by pressure due to expansion in the resin sealing process and the reflow process. This may cause a problem of an electric characteristic fluctuation or the like caused by cracks and internal distortion of the electronic device 5. Also, in a case in which the liquid connecting member 12 is to be provided to the mounting board 2, the liquid serving as the connecting member 12 may flow into the through hole 17 and close the through hole 17 when the through hole 17 and the connecting member 12 are close to each other. Further, in the normal manufacturing process, since a surface of the mounting board 2 opposed to the other surface to be provided with the electronic device 5 is secured by means of vacuum adsorption to hold the mounting board 2, an adsorption force is generated from the space 13 to the through hole 17, which facilitates inflow of the connecting member 12 into the through hole 17. As a result, the through hole 17 will be closed by the connecting member 12, and the space 13 and the external part of the electronic component 1 cannot communicate with each other. The space 13 may be expanded at the time of reflow, and the electronic component 1 may be damaged.

Also, even when the through hole 17 is closed by a breathable film on the lower side of the mounting board 2, the through hole 17 is opened on the upper surface side of the mounting board 2 provided with the connecting member 12. Thus, when the electronic device 5 is secured, the connecting member 12 will flow into the through hole 17, and the through hole 17 will be closed. Also, due to the breathable film, the aforementioned vacuum adsorption for securing the mounting board 2 will take effect, and the through hole 17 will highly possibly be closed by the connecting member 12.

In a case in which the electronic device 5 is secured to the mounting board 2 by the connecting member 12 only at the peripheral region 52, the electronic device 5 will be flexed by pressure due to expansion in the resin sealing process and the reflow process, which may cause a problem of an electric characteristic fluctuation or the like caused by cracks and internal distortion of the electronic device 5. Also, in a case of the auto focus sensor, due to flexure of the electronic device 5, positional variation of the photodiodes in the device plane can be generated. As a result, the positional relationship between a focal point position of light split into two by the glasses lens and a position of the photodiode will be disrupted, and an accurate distance to a light source may not be able to be measured.

Also, in the manufacturing process, when the rear surface 4 of the mounting board 2 is secured by means of vacuum adsorption to hold the mounting board 2, an adsorption force is generated from the space 13 to the through hole 17, which facilitates inflow of the connecting member 12 into the through hole 17. As a result, the through hole 17 will be closed by the connecting member 12, and the breathability from the space 13 to the external part of the electronic component 1 cannot be secured. When the space 13 is closed, the space 13 may be expanded at the time of reflow, and the resin member 14 and the electronic device 5 may be cracked.

In the present embodiment, the space 13 surrounded by the electronic device 5, the front surface 3 of the mounting board 2, and the peripheral part 18 of the connecting member 12 and the through hole 17 penetrating the front surface 3 and the rear surface 4 of the mounting board 2 and causing the space 13 and the external part of the electronic component 1 to communicate with each other are provided. Accordingly, expansion at the time of reflow can be prevented, and cracks of the resin member 14 and the electronic device 5 can be restricted.

As the connecting member 12, not only the peripheral part 18 arranged in the peripheral region 52 of the electronic device 5 but also the central part 19 arranged in the central region 51 of the electronic device 5 is provided. Accordingly, flexure of the electronic device 5 generated in the resin sealing process can be restricted, and an electric characteristic fluctuation caused by cracks and internal distortion of the electronic device 5, measurement variation caused by optical distance displacement, and the like can be restricted.

In the method for manufacturing the electronic component 1, the mounting board 2 with no through hole 17 is prepared, the electronic device 5 is secured on the mounting board 2 via the connecting member 12, and the through hole 17 can then be formed. This can solve the problem in which the through hole 17 is closed by the connecting member 12 due to vacuum adsorption of the mounting board 2 can be solved, and it is possible to cause the space 13 to communicate with the external part of the electronic component 1 reliably.

Second Embodiment

Figure 4A:
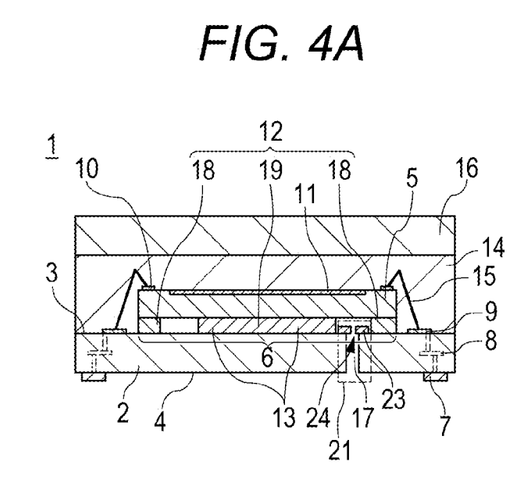
FIGS. 4A-4D illustrate schematic cross-sectional views and schematic plan views illustrating the electronic component.
Figure 4B:
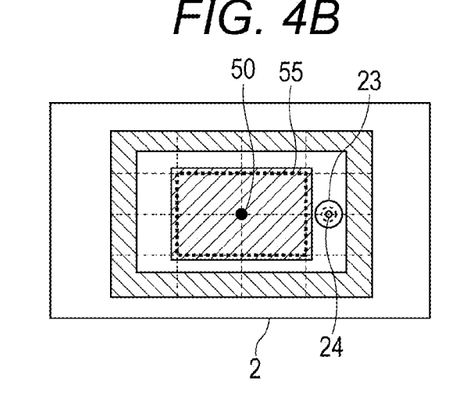

A structure of the electronic component 1 according to a second embodiment will be described with reference to a schematic cross-sectional view in FIG. 4A and a plan view in FIG. 4B. The second embodiment is similar to the first embodiment except that a structure around the through hole 17 differs.

The electronic component 1 includes the opening portion 21. The opening portion 21 includes the through hole 17 provided in the mounting board 2 and a film 23 provided on the front surface 3 of the mounting board 2 to cover the through hole 17. An opened hole 24 is formed in the film 23. The hole 24 of the film 23 causes the through hole 17 and the space 13 to communicate with each other.

The thickness of the film 23 is preferably 50 μm or less. Since the film 23 is thin, the hole 24 formed in the film 23 can have a short diameter, and the hole 24 having a diameter of approximately 10 to 100 μm can be formed, for example. In the present embodiment, the hole 24 can be formed to have a short diameter to enable entrance of foreign substances from the external part of the electronic component 1 to be restricted further. Entrance of moisture can also be restricted. In particular, as for entrance of foreign substances, in a case in which the electronic component 1 is an imaging device, and in which the package structure is a below-mentioned hollow package structure, foreign substances can be restricted from attaching to a pixel surface of the imaging device, and an image quality can be maintained. Also, in a case in which the mounting board 2 is a ceramic or a printed wiring board, for example, an inner wall surface of the through hole 17 is a source of foreign substances since the inner wall surface of the through hole 17 is not subject to particular processing and thus generates frequent dropping of the ceramic and frequent dropping of glass fiber and prepreg serving as materials for the wiring board. Accordingly, in the present embodiment, in which the film 23 is formed on the through hole 17, and in which the small hole 24 is opened in the film 23, an effect of restricting entrance of foreign substances can be exerted. Also, in the present embodiment, the film 23 is provided on the front surface 3 of the mounting board 2. Although the film 23 may be provided over the entire area on the front surface 3 of the mounting board 2, it is more preferable to provide the film 23 partially on the through hole 17. In the case in which the film 23 is provided partially, it is preferable not to arrange the connecting member 12 on the film 23. It is preferable not to bring the connecting member 12 into contact with the film 23. Since the film 23 acts as a passage for air, vapor, foreign substances, and the like from an external part, stress is applied at least to the film 23 when they pass through the film 23. By forming the film 23 partially and preventing the connecting member 12 from being arranged on the film 23, the generated stress can be prevented from being transmitted to the connecting member 12, and detachment and the like of the connecting member 12 can be prevented. A material for the film 23 is not particularly limited. The film 23 is photoresist, dry film resist, liquid resist, or the like and is made of epoxy resin, acrylic resin, or the like. Also, in a case in which the hole 24 is formed with use of a laser beam 25, the film 23 adapted to absorb the laser beam 25 to be used can arbitrarily be selected.

FIGS. 5A to 5I illustrate a method for manufacturing the electronic component 1 according to the second embodiment. The method is similar to the manufacturing method according to the first embodiment except that the through hole 17 is constituted by the aforementioned through hole 17 and the hole 24 in the film 23. The method is also similar to the manufacturing method according to the first embodiment except that, in FIG. 5B, a method for forming the hole 24 in the film 23 is using an optical unit such as the laser beam 25.

Figure 5A:
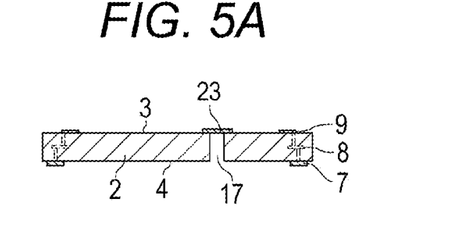
FIGS. 5A-5I illustrate schematic views illustrating a method for manufacturing the electronic component.
Figure 5B:
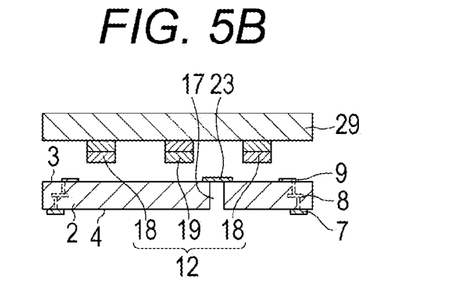
Figure 5C:
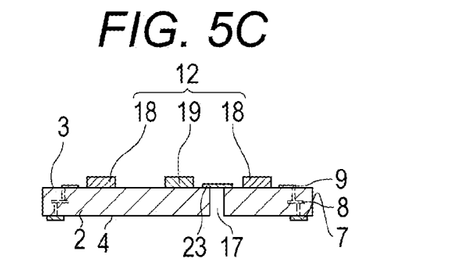
Figure 5D:
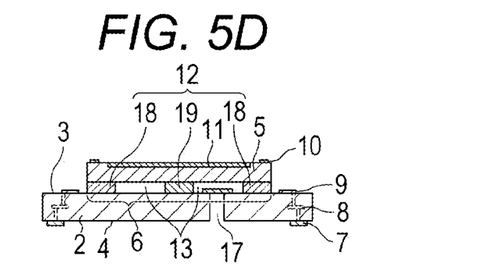
Figure 5E:
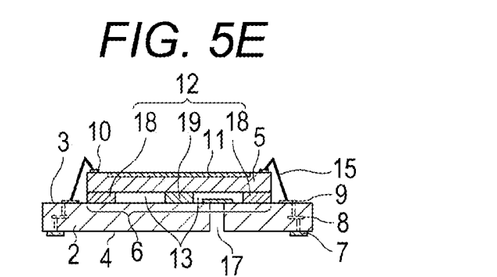
Figure 5F:
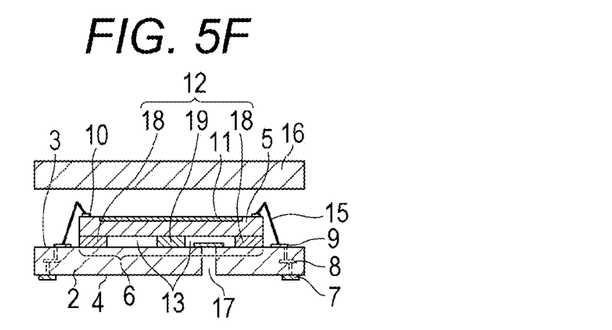
Figure 5G:
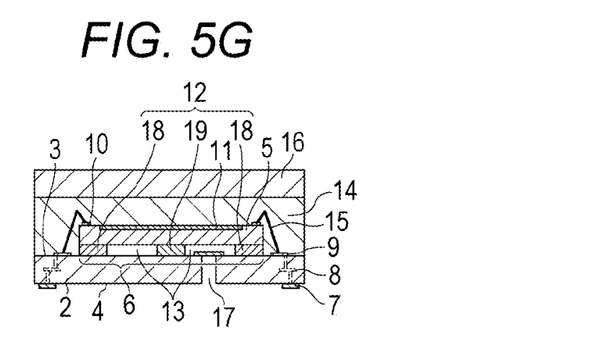
Figure 5H:
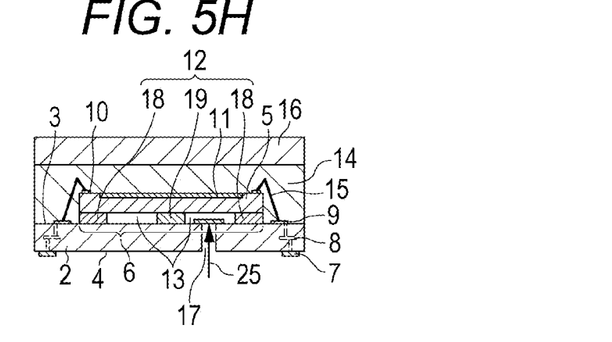
Figure 5I:
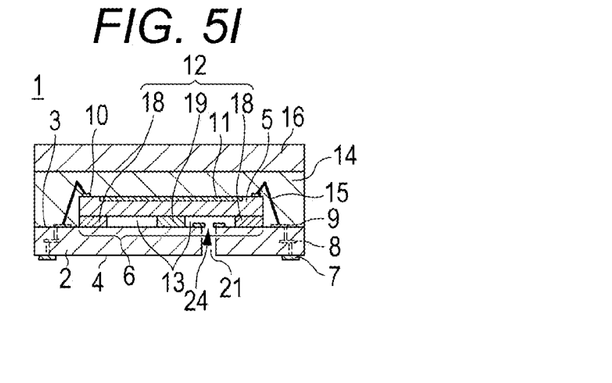

A case in which the hole 24 is formed in the film 23 with use of an optical unit such as the laser beam 25 is favorable in that opening time can be shortened since the film 23 is thin, and in that damage and vibration of the electronic device 5 resulting from local heating of the electronic component 1 can be restricted.

Third Embodiment

A third embodiment will be described in detail. The third embodiment is similar to the second embodiment except that a process of forming the hole 24 differs.

The hole 24 is formed by heating at least the mounting board 2. It is preferable to heat the entire electronic component 1. Examples of a way for heating are an oven, a hot plate, and a reflow furnace. By heating the mounting board 2 or the electronic component 1, pressure in the space 13, which is a sealed space, can be increased. When the pressure increases, the pressure in the space 13 breaks the film 23, and an opening that causes the space 13 and an external space to communicate with each other can be formed. Also, when the pressure in the space 13 increases, the pressure is applied to the electronic device 5 as well. However, in the present embodiment, since the central part 19 of the connecting member 12 is provided to secure the electronic device 5, the electronic device 5 can be prevented from being deformed.

To facilitate opening of the film 23 when pressure is applied, an aspect ratio of the diameter of the through hole 17 to the length of the through hole 17 is preferably 2 or higher. Also, a film thickness of the film 23 is preferably 25 μm or less and more preferably 10 μm or less.

The connecting member 12 can be used without particular limitation. In a case in which the connecting member 12 is a thermally cured connecting member 12, the connecting member 12 is cured at a first heating temperature. Subsequently, in the process of forming the hole 24, the hole 24 is preferably opened by increasing pressure in the space 13 at a second heating temperature, which is higher than the first heating temperature. The reason for this is the following. In a case in which the film 23 is opened at the first heating temperature, the connecting member 12 may enter the through hole 17 and close the through hole 17. Preferably, the hole 24 is not opened at the first heating temperature and is opened at a higher heating temperature than the first heating temperature. Also, a glass transition temperature of the film 23 is preferably higher than the first heating temperature and lower than the second heating temperature. In this case, since strength and elasticity modulus of the film 23 decrease in a state at the second heating temperature, the film 23 can be opened more reliably.

Fourth Embodiment

The electronic component 1 according to a fourth embodiment differs from the electronic component 1 illustrated in FIGS. 1A-1C in that no translucent member 16 is provided. Except this, the fourth embodiment is similar to the second embodiment. In this case, for the resin member 14, resin such as epoxy resin and silicone resin can be used without particular limitation. Also, as a sealing method with use of the resin member 14, not only printing and dispensing but also injection molding and transfer molding can be performed.

Fifth Embodiment

Figure 4C:
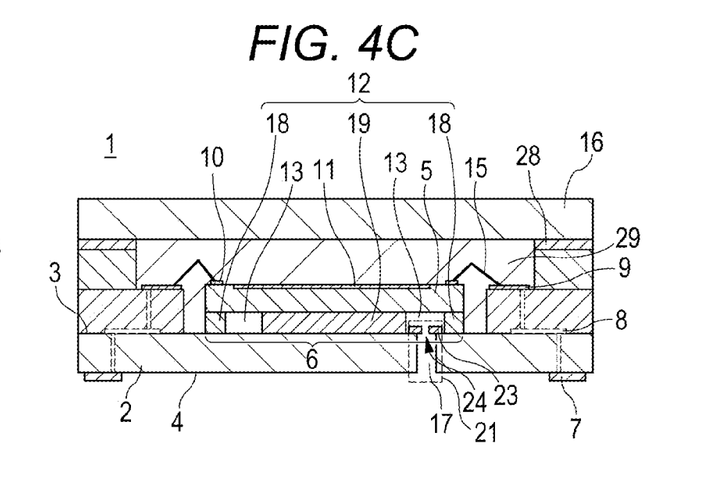
Figure 4D:
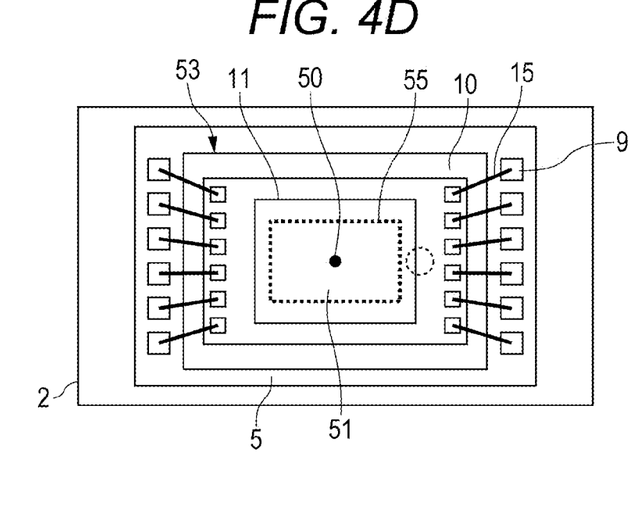

FIGS. 4C and 4D illustrate a fifth embodiment. FIG. 4C is a schematic cross-sectional view, and FIG. 4D is a schematic plan view. The electronic component 1 according to the fifth embodiment illustrated in FIGS. 4C and 4D is similar to the electronic component 1 according to the second embodiment illustrated in FIGS. 4A and 4B except that the electronic component 1 is a hollow package.

In the electronic component 1 in FIG. 4C, the mounting board 2 having a cavity is used. The mounting board 2 includes a frame portion adapted to form the cavity. The mounting board 2 having the cavity is a recessed mounting member and can be made of a material such as a ceramic and glass epoxy. In the mounting board 2 having the cavity, the electronic device 5 is secured by the connecting member 12.

The translucent member 16 is connected to the frame portion, above the upper part of the mounting board 2 having the cavity, with use of an adhesive member 28 for the translucent member 16. Since the translucent member 16 is connected to the entire circumference on the upper surface of the mounting board 2 having the cavity, the entire circumference is an adhesive region, and a hollow portion 29 is formed. The thickness of the adhesive member 28 for the translucent member 16 is approximately 10 to 100 μm. The adhesive member 28 is thermally cured resin, ultraviolet cured resin, thermoplastic resin, or the like.

In the case of the aforementioned hollow package, any of the shapes of the connecting member 12 illustrated in FIGS. 2A-2D can be applied. For example, as illustrated in FIG. 2A, the peripheral part 18 is preferably annular.

The peripheral part 18 is formed in an annular shape to enable entrance of foreign substances and the like from the through hole 17 into the hollow portion 29 to be prevented. That is, no electric failure caused by attachment of foreign substances to the conductive member 15 will occur. Also, in a case in which the electronic device 5 is an imaging device, no image failure caused by attachment of foreign substances to the imaging device surface will occur. Further, in a case in which the peripheral part 18 is annular, the hollow portion 29 is a sealed space, and the internal pressure of the hollow portion 29 increases or decreases due to an increase or a decrease of an ambient temperature and a temperature increase at the time of reflow. However, even when the internal pressure increases or decreases, the electronic device 5 can be prevented or restricted from being deformed since the central region 51 of the electronic device 5 is provided with the central part 19 of the connecting member 12.

In a method for manufacturing the electronic component 1 according to the fifth embodiment, the electronic device 5 is secured in the cavity of the mounting board 2 with use of the connecting member 12. Subsequently, the translucent member 16 is attached to the frame portion 27 of the mounting board 2 with use of the adhesive member 28 for the translucent member 16 so that the translucent member 16 may be opposed to the electronic device 5 via the hollow portion 29. The adhesive member 28 for the translucent member 16 may be applied to the translucent member 16 or the mounting board 2. The adhesive member 28 for the translucent member 16 is ultraviolet cured resin, for example.

After the translucent member 16 is attached to seal the hollow portion 29, the hole 24 is formed in the film 23 to cause the space 13 and the through hole 17 to communicate with each other, and air in the space 13 can be exhausted via the through hole 17. It is to be noted that, as in FIG. 2D, by opening the peripheral part 18, the hollow portion 29 and the space 13 can communicate with each other, and air in the hollow portion 29 can be exhausted.

Sixth Embodiment

For example, in a method for manufacturing the electronic component 1, as illustrated in FIGS. 6A-6E, a plurality of electronic devices 5 are secured to the mounting board 2 serving as an aggregate board, the processes in FIGS. 3A-3I are performed in a similar manner, and the mounting board 2 is finally diced into pieces. In this manner, the plurality of electronic devices 5 can be manufactured at a time.

Figure 6A:
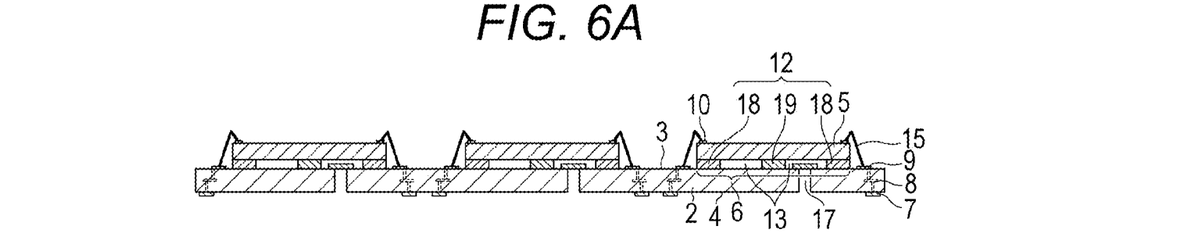
FIGS. 6A-6E illustrate schematic views illustrating a method for manufacturing the electronic component.

In a process illustrated in FIG. 6A, the mounting board 2 serving as an aggregate board including the front surface 3 and the rear surface 4 and including on the front surface 3 a plurality of mounting regions 6 for the electronic devices 5 is prepared. Also, in the process illustrated in FIG. 6A, the connecting members 12 are arranged at a plurality of mounting regions for the electronic devices 5 on the mounting board 2 serving as an aggregate board so that each of the plurality of electronic devices 5 can be provided with the peripheral part 18 of the connecting member 12 and the central part 19 of the connecting member 12. Further, in the process illustrated in FIG. 6A, the electronic devices 5 are mounted on the connecting members 12 to secure the plurality of electronic devices 5 on the mounting board 2 serving as an aggregate board. At this time, the spaces 13 each surrounded by the electronic device 5, the front surface 3 of the mounting board 2 serving as an aggregate board, and the peripheral part 18 of the connecting member 12 are formed.

Figure 6B:
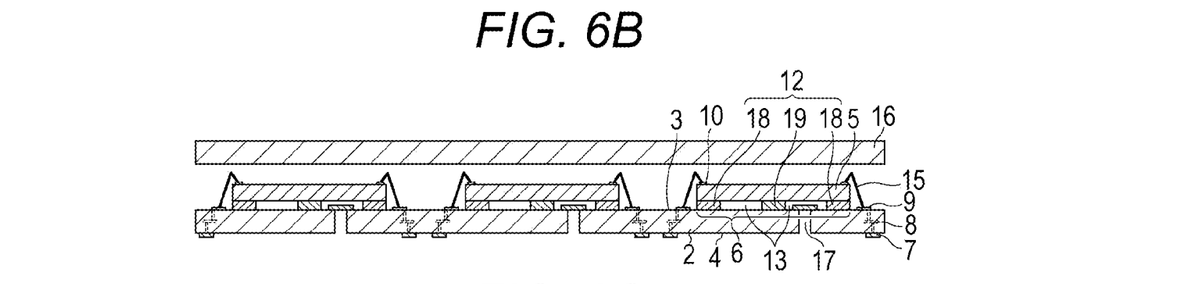

Subsequently, in a process illustrated in FIG. 6B, the translucent member 16 is mounted over the mounting board 2 serving as an aggregate board.

Figure 6C:
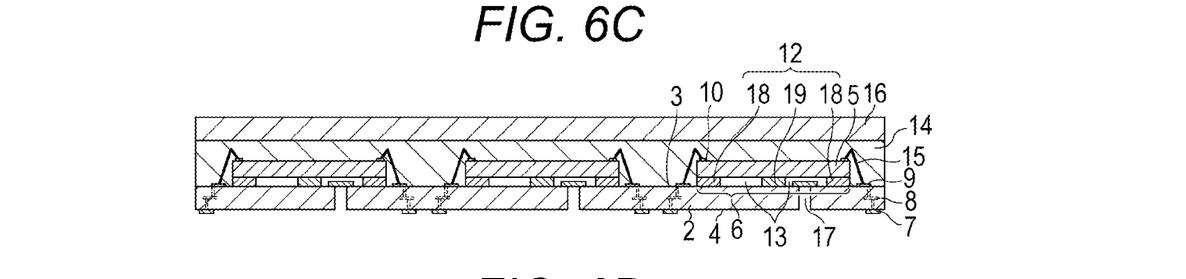

Subsequently, in a process illustrated in FIG. 6C, a gap is provided between the translucent member 16 and the mounting board 2 serving as an aggregate board, and the resin member 14 is filled by means of injection to cover the plurality of electronic devices 5. The resin member 14 is cured by means of heating or ultraviolet irradiation. It is to be noted that the resin member 14 may be arranged on the mounting board 2, and that the translucent member 16 may then be arranged on the resin member 14.

Figure 6D:
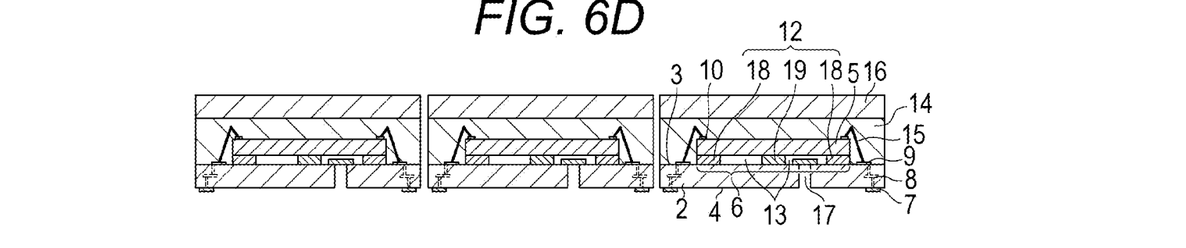

Subsequently, in a process illustrated in FIG. 6D, the mounting board 2 serving as an aggregate board provided with the translucent member 16 is cut by means of dicing into pieces (chips) serving as the electronic components 1. It is preferable to form each through hole 17 after dicing since a cutting fluid and a lubricant to be used at the time of dicing may flow through the through hole 17 into the space 13 and generate corrosion of interconnection provided in the electronic devices 5 and the mounting board 2.

Figure 6E:
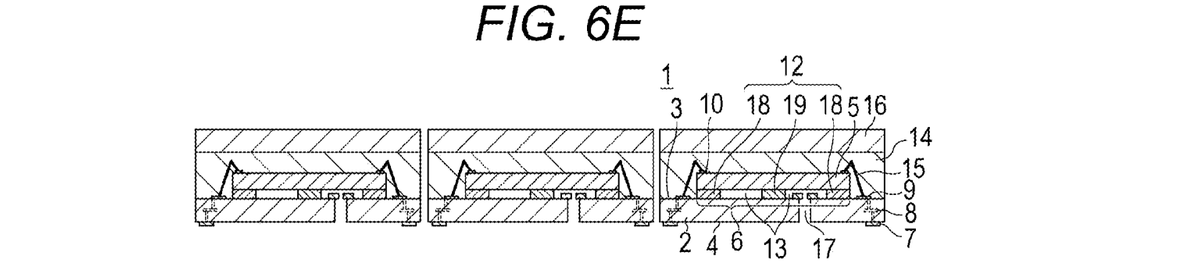

Subsequently, in a process illustrated in FIG. 6E, each of the diced electronic components 1 is provided with the hole 24 causing the space 13 and the external part of the electronic component 1 to communicate with each other with use of a mechanical unit or an optical unit. Meanwhile, although, as described above, the process of forming the hole 24 is preferably after the dicing process, the hole 24 can be opened any time after formation of the space 13. The reason for this is that, in a case in which the hole 24 is opened before dicing, a cutting fluid and the like will flow at the time of dicing, and the moisture can be removed by drying. Also, in this example, the through hole 17 is provided in the mounting board 2 in advance, and the hole 24 is then formed in the film 23. However, the through hole 17 may be formed after formation of the connecting member 12 in a similar manner to that in the first embodiment. In this case as well, the through hole 17 may be formed before or after the dicing process.

The manufacturing method is summarized as follows.

Manufacturing Method (1): A method for manufacturing an electronic component including preparing a board, preparing an electronic device including a first region including a center of the electronic device and a second region between the first region and an edge of the electronic device, connecting the board to the electronic device via a connecting member arranged between the board and the first region of the electronic device, and, after the connecting, causing a space between the board and the electronic device to communicate with an open space on an opposite side of the electronic device with respect to the board.

Manufacturing Method (2): The method for manufacturing an electronic component according to (1), wherein, in the connecting, the board is provided with a through hole covered with a film, and wherein, in the communicating, the film is processed to cause the space and the open space to communicate with each other.

Manufacturing Method (3): The method for manufacturing an electronic component according to (1) and (2), wherein, in the connecting, the film is arranged between the board and the electronic device.

Manufacturing Method (4): The method for manufacturing an electronic component according to (1) to (3), wherein the processing is performed by irradiation of the film with a laser beam or by heating of the board.

Manufacturing Method (5): The method for manufacturing an electronic component according to (1) to (4), wherein, in the connecting, a plurality of electronic devices including the electronic device are provided on the board, and further including, between the connecting and the communicating, cutting the board into pieces to correspond to the plurality of electronic devices.

Example 1

Example 1 will be described in detail below. In Example 1, an electronic component 1A described in the first embodiment is manufactured.

First, as the electronic devices 5, thirty five auto focus sensors of 15.06 mm×6.98 mm×250 µm are prepared. The mounting board 2 serving as an aggregate board of 92 mm×138 mm×0.3 mm is prepared.

Subsequently, the thermally cured connecting members 12 are applied to the plurality of mounting regions for the electronic devices 5 on the mounting board 2 serving as an aggregate board. As each of the thermally cured connecting members 12, the connecting member 12 consisting mainly of epoxy resin having a curing temperature of 130° C. and having a glass transition temperature of 150° C. is used. The connecting members 12 are applied with use of the transfer stamp 29 in an arrangement as in FIG. 2A. Each of the peripheral parts 18 is arranged in an annular shape at the outer circumference of the electronic device 5 with a width of approximately 300 µm. Each of the central parts 19 is arranged in a circular shape having a diameter of approximately 1 mm at the central region 51 of the chip. Subsequently, each of the electronic devices 5 is mounted on each of the thermally cured connecting members 12, attached, and secured.

Subsequently, the thermally cured connecting members 12 are thermally cured to secure the electronic devices 5 to the mounting board 2. Subsequently, with use of a wire bonding apparatus, the connection terminals of the electronic devices 5 and the internal connection terminals of the mounting board 2 are electrically connected by gold wires.

Subsequently, as the translucent member 16, a borosilicate glass plate of 82 mm×128 mm×0.7 mm is prepared. The borosilicate glass plate is arranged in parallel at a position approximately 1.46 mm away from the front surface 3 of the mounting board 2 serving as an aggregate board, and transparent ultraviolet cured acrylic resin is supplied between the glass plate and the mounting board 2 serving as an aggregate board to seal the electronic devices 5. The acrylic resin is then cured by means of ultraviolet irradiation. The mounting board 2 is thereafter cut into pieces corresponding to the electronic devices 5 with use of a wet dicing machine to obtain the electronic components 1 each having a size of 18.6 mm×11.2 mm. The thickness of each of the electronic components 1 is 1.81 mm.

The through hole 17 of ϕ1 mm is opened in the mounting board 2 by a drill to communicate with the space 13 of the diced electronic component 1. In the above processes, thirty five electronic components 1A in FIGS. 1A-1C are manufactured.

Also, after the thirty five electronic components 1A absorb vapor under predetermined vapor absorption conditions, the electronic components 1A are put into a reflow furnace having a peak temperature of 240° C. When appearance observation of the electronic components 1A is performed after the reflow, it can be confirmed that the acrylic resin parts have no abnormalities such as cracks. Also, when the planarity of the electronic devices 5 is measured at a room temperature and at 70° C., the result is at the level of several µm, which is not problematic.

Example 2

Example 2 will be described in detail below. In Example 2, an electronic component 1B described in the second embodiment is manufactured.

In Example 2, the mounting board 2 serving as an aggregate board, provided in advance at each of the mounting regions thereof for the electronic devices 5 with the through hole 17 of φ500 µm and covered on a side of the through hole 17 on which the front surface 3 is located with the film 23 made of solder resist having a thickness of 50 µm, is prepared. Also, after dicing, the film 23 made of solder resist is irradiated with YAG laser to form the hole 24 of approximately 200 µm. Except these, Example 2 is similar to Example 1, and thirty five electronic components 1B are manufactured.

After the manufactured thirty five electronic components 1B absorb vapor under predetermined vapor absorption conditions, the electronic components 1B are put into a reflow furnace having a peak temperature of 240° C. When appearance observation of the electronic components 1B is performed after the reflow, it can be confirmed that the acrylic resin parts have no abnormalities such as cracks. Also, when the planarity of the electronic devices 5 is measured at a room temperature and at 70° C., the result is at the level of several µm, which is not problematic.

Example 3

Example 3 according to the present disclosure will be described in detail below. In Example 3, an electronic component 1C described in the third embodiment of the present disclosure is manufactured.

In Example 3, as the film 23 made of solder resist, the film made of solder resist having a thickness of 5 µm is prepared. Also, after dicing, the electronic components 1C are put into an oven at 200° C. After the electronic components 1C are taken out of the oven, it is confirmed if the holes 24 are opened in the films 23 made of solder resist of all of the electronic components 1C. Except these, Example 3 is similar to Example 2, and thirty five electronic components 1C are manufactured.

After the manufactured thirty five electronic components 1C absorb vapor under predetermined vapor absorption conditions, the electronic components 1C are put into a reflow furnace having a peak temperature of 240° C. When appearance observation of the electronic components 1C is performed after the reflow, it can be confirmed that the acrylic resin parts have no abnormalities such as cracks. Also, when the planarity of the electronic devices 5 is measured at a room temperature and at 70° C., the result is at the level of several µm, which is not problematic.

Example 4

Example 4 will be described in detail below. In Example 4, an electronic component 1D described in the fourth embodiment is manufactured.

In Example 4, after wire bonding, the entire mounting board 2 serving as an aggregate board is put into a transfer molding machine, and the electronic devices 5 are provided with black epoxy resin to form mold resin. Except this, Example 4 is similar to Example 2, and thirty five electronic components 1D are manufactured.

After the manufactured thirty five electronic components 1D absorb vapor under predetermined vapor absorption conditions, the electronic components 1D are put into a reflow furnace having a peak temperature of 240° C. When observation of the mold parts of the electronic components 1D is performed with use of an X-ray evaluation apparatus after the reflow, it can be confirmed that the mold resin parts have no abnormalities such as cracks. Also, when the planarity of the electronic devices 5 is measured at a room temperature and at 70° C. with use of the X-ray evaluation apparatus, the result is at the level of several µm, which is not problematic.

Example 5

Example 5 will be described in detail below. In Example 5, an electronic component 1E described in the fifth embodiment is manufactured.

First, as the mounting board 2 having the cavity, a resin package made of FR4 is prepared. The mounting board 2 having the cavity, provided in advance at each of the mounting regions thereof for the electronic devices 5 with the through hole 17 of φ500 µm and covered on a side of the through hole 17 on which the front surface 3 is located with the film 23 made of solder resist having a thickness of 50 µm, is prepared.

Also, as each of the electronic devices 5, a CMOS image sensor of an APS-C size of 24 mm×20 mm×250 µm is prepared.

Subsequently, the thermally cured connecting member 12 is applied to a bottom portion of the cavity in the mounting region for the electronic device 5. As the thermally cured connecting member 12, the connecting member 12 consisting mainly of epoxy resin having a curing temperature of 130° C. and having a glass transition temperature of 150° C. is used. The connecting member 12 is applied with use of a dispenser in an arrangement as in FIG. 2A. The peripheral part 18 is arranged in an annular shape at the outer circumference of the electronic device 5 with a width of approximately 300 µm. The central part 19 is arranged in a circular shape having a diameter of approximately 1 mm at the central region 51 of the chip. Subsequently, the electronic device 5 is mounted on the thermally cured connecting member 12, attached, and secured.

Subsequently, the thermally cured connecting member 12 is thermally cured to secure the electronic device 5 to the mounting board 2 having the cavity. Subsequently, with use of a wire bonding apparatus, the connection terminals of the electronic device 5 and the internal connection terminals of the mounting board 2 having the cavity are electrically connected by gold wires.

Subsequently, with use of ultraviolet cured resin, a borosilicate glass plate is attached and secured to the upper surface of the mounting board 2 having the cavity. The film 23 made of solder resist is irradiated with YAG laser to form the hole 24 of approximately 200 µm. In this manner, thirty five electronic components 1E are manufactured.

After the manufactured thirty five electronic components 1E absorb vapor under predetermined vapor absorption conditions, the electronic components 1E are put into a reflow furnace having a peak temperature of 240° C. When appearance observation of the electronic components 1E is performed after the reflow, it can be confirmed that there are no particular abnormalities. Also, when the planarity of the electronic devices 5 is measured at a room temperature and at 70° C., the result is at the level of several μm, which is not problematic.

Comparative Example

As a comparative example, for comparison with the aforementioned electronic components 1A to 1E, thirty five pieces for each of the electronic components 1A' to 1E' provided with no central parts 19 of the connecting members 12 are manufactured. The respective electronic components 1A' to 1E' are manufactured in similar manners to those in Examples 1 to 5 except that no central parts 19 of the connecting members 12 are provided. In each set of the electronic components 1A' to 1E', several to several tens of abnormal components can be observed. As for the electronic components 1A' to 1C', cracks can be observed in the acrylic resin parts, and the planarity of the electronic devices 5 can be in a value at a failed level. Also, as for the electronic components 1D', cracks can be observed in the black mold in the X-ray observation, and the planarity of the electronic devices 5 can be in a value at a failed level. Further, as for the electronic components 1E', the planarity can be at a failed level at which the image is out of focus.

According to the present disclosure, reliability of the electronic component can be improved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-037712, filed Feb. 28, 2017, which is hereby incorporated by reference herein in its entirety.

What is claimed is:

1. An electronic component comprising:
a board;
an electronic device arranged over the board; and
a connecting member arranged between the board and the electronic device,
wherein the electronic device includes a first region including a center of the electronic device and a second region between the first region and an edge of the electronic device,
wherein the connecting member includes a first part arranged between the first region of the electronic device and the board and a second part arranged between the second region of the electronic device and the board,
wherein a distance from the edge to the first part is longer than a distance from the center to the first part, and a distance from the edge to the second part is shorter than a distance from the center to the second part,
wherein a space is provided between the electronic device and the board and between the first part and the second part, and
wherein, in the board, a through hole communicating with the space is provided not to overlap with the center of the electronic device.

2. The electronic component according to claim 1, wherein the space is surrounded by the second part.

3. The electronic component according to claim 1, wherein, in a position overlapping with a line segment connecting the center to the edge, the space is provided between the first part and the second part.

4. The electronic component according to claim 1, wherein a boundary between the first region and the second region is defined as a line connecting midpoints of a plurality of line segments connecting the center to respective points on the edge.

5. An electronic component comprising:
a board;
an electronic device arranged over the board; and
a connecting member arranged between the board and the electronic device,
wherein the connecting member is arranged to overlap with a center of the electronic device,
wherein a space is provided between the electronic device and the board, and
wherein, in the board, a through hole communicating with the space is provided and the through hole does not overlap with the center of the electronic device.

6. The electronic component according to claim 1, wherein the connecting member is surrounded by the space.

7. The electronic component according to claim 1, wherein a plurality of spaces including the space are formed between the electronic device and the board, and in the board, a plurality of through holes are provided to correspond to the plurality of respective spaces.

8. The electronic component according to claim 1, wherein a film covering the through hole is provided between the board and the electronic device, and the film is provided with a hole causing the through hole and the space to communicate with each other.

9. The electronic component according to claim 8, wherein the connecting member does not contact the film.

10. The electronic component according to claim 7, wherein a thickness of the film is 50 μm or less.

11. The electronic component according to claim 1, further comprising:
a translucent member opposed to the electronic device,
wherein the electronic device is arranged between the translucent member and the board.

12. The electronic component according to claim 1, further comprising:
a resin member configured to cover the board and the electronic device.

13. The electronic component according to claim 1, further comprising:
a translucent member opposed to the electronic device; and
a resin member configured to contact the board and the translucent member,
wherein the resin member includes a part located between the translucent member and the electronic device.

14. The electronic component according to claim 1, wherein the electronic device is an optical device.

15. An electronic equipment comprising:
the electronic component according to claim 1;
an interconnection board configured to mount the electronic component thereon; and
a solder member provided between the board of the electronic component and the interconnection board.

16. The electronic component according to claim 5, wherein the connecting member is surrounded by the space.

17. The electronic component according to claim 5, wherein a film covering the through hole is provided between the board and the electronic device, and the film is provided with a hole causing the through hole and the space to communicate with each other.

18. The electronic component according to claim 5, further comprising:

a translucent member opposed to the electronic device; and a resin member configured to contact the board and the translucent member, wherein the resin member includes a part located between the translucent member and the electronic device.

19. The electronic component according to claim 5, wherein the electronic device is an optical device.

20. An electronic equipment comprising:
an electronic component including:
  a board;
  an electronic device arranged over the board; and
  a connecting member arranged between the board and the electronic device,
  wherein the connecting member is arranged to overlap with a center of the electronic device,
  wherein a space is provided between the electronic device and the board, and
  wherein, in the board, a through hole communicating with the space is provided and the through hole does not overlap with the center of the electronic device;
an interconnection board configured to mount the electronic component thereon; and
a solder member provided between the board of the electronic component and the interconnection board.

* * * * *